United States Patent [19]

McGinn

[11] Patent Number: 4,796,102
[45] Date of Patent: Jan. 3, 1989

[54] AUTOMATIC FREQUENCY CONTROL SYSTEM

[75] Inventor: Michael McGinn, Scottsdale, Ariz.

[73] Assignee: Motorola, Inc., Schaumburg, Ill.

[21] Appl. No.: 81,041

[22] Filed: Aug. 3, 1987

[51] Int. Cl.$^4$ .......................... H04N 5/50; H04B 1/18
[52] U.S. Cl. ................................ 358/195.1; 455/258; 455/260
[58] Field of Search ................. 358/195.1, 191.1, 197; 455/257, 258, 260, 255, 262, 263, 265, 182

[56] References Cited

U.S. PATENT DOCUMENTS

| | | | |
|---|---|---|---|
| 4,461,035 | 7/1984 | Sakamoto | 358/195.1 |
| 4,490,743 | 12/1984 | Mycynek | 358/197 |
| 4,575,761 | 3/1986 | Carlson | 358/195.1 |
| 4,596,046 | 6/1986 | Richardson | 455/260 |
| 4,625,331 | 11/1986 | Richardson | 455/260 |

*Primary Examiner*—Tommy P. Chin
*Attorney, Agent, or Firm*—Michael D. Bingham

[57] ABSTRACT

An automatic frequency control circuit (AFC) is provided for use in a television receiver having a local oscillator (LO), an intermediate frequency (IF) demodulator section, and a phase locked loop (PLL) for acquiring and phase locking onto the IF signal. The AFC circuit comprises an acquistion circuit for sensing and detecting a no signal condition, an out of lock signal condition and phase locked condition. During a no signal condition the acquisition circuit enables offset and clamp circuits for respectively setting the nominal operating frequencies of the voltage controlled oscillator (VCO) of the PLL and the LO to the center frequency of the IF passband. Upon appearance of an IF signal the acquisition circuit enables a sweep circuit as the receiver is in an out of lock condition in order to sweep the VCO downward from the passband center frequency to just above the sound carrier frequency and then sweeps the VCO frequency upwards toward the video carrier frequency. During the downward sweep of the VCO the acquisition circuit disables the phase detector of the PLL to inhibit spurious lock up. Upon the VCO phase locking to the IF signal the clamp, sweep and offset circuits are disabled while the phase detector is enabled.

5 Claims, 2 Drawing Sheets

AUTOMATIC FREQUENCY CONTROL SYSTEM

CROSS REFERENCE TO RELATED APPLICATIONS

The subject matter of the present invention is related to the subject matter of U.S. Pat. No. 4,739,284 entitled "PHASE LOCKED LOOP HAVING FAST FREQUENCY LOCK STEERING CIRUCIT" and U.S. patent application, Ser. No. 80,934, filed On Aug. 3, 1987, entitled "VIDEO DEMODULATOR SYSTEM".

BACKGROUND OF THE INVENTION

The present invention relates to automatic frequency control (AFC) circuits and, more particularly, to a high gain phase locked loop (PLL) AFC system suited to be utilized in combination with a high performance television receiver.

In a typical television receiver AFC system the intermediate frequency (IF) signal is first limited to remove amplitude modulation therefrom and then supplied to a frequency discriminator circuit. A tuned circuit and a multiplier are required to convert a frequency deviation of the IF signal from its nominal frequency into a change in voltage at the output of the multiplier. This voltage is then applied to the local oscillator (LO) in the tuner section of the television receiver to, in turn, cause a resultant change in the IF signal as understood. The tuned circuit and multiplier form a phase detector. Thus, a change in the IF signal from the nominal center frequency of the tuned circuit produces a change in phase from the initial ninety degrees between the two inputs to the double balanced multiplier. This change in phase is therefore the reason a change in the drive voltage to the LO is produced.

The typical AFC system described above has several serious disadvantages associated therewith. First, the tuned circuit has to be adjusted and is in fact a source of radiation that can cause instability in the IF signal detection. Secondly, due to the characteristics of the IF bandpass filter, the AFC loop characteristics are asymmetrical. One of the effects of this asymmetry is that system noise will add a direct current component to any direct current offsets in the loop and, hence, is one of the factors limiting the direct current loop gain. Low loop gain in turn leads to large frequency errors at the input tuner which limits system acquisition which is highly undesirable. Finally, the coil of the tuned circuit is expensive and must be adjusted which is also undesirable.

Hence, a need exists for an improved AFC system having high gain loop characteristics which eliminates the need for a separate AFC tuned circuit

SUMMARY OF THE INVENTION

Accordingly, it is an object of the present invention to provide an improved automatic frequency control system having high loop gain and low direct current offsets and noise characteristics In accordance with the above and other objects there is provided a television receiver having a local oscillator (LO), an intermediate frequency (IF) demodulator section including a pair of quadrature operated demodulators, a phase locked loop including a phase detector and a voltage controlled oscillator (VCO) for phase locking onto a received IF signal, the improvement comprising an automatic frequency control circuit including a sensing circuit for detecting the absence or presence of the IF signal to provide a plurality of enabling and disabling control signals at respective outputs, said sensing means being coupled to respective outputs of the demodulators; an offset circuit coupled to a first output of said sensing circuit which is enabled thereby in the absence of the IF signal for providing a control signal to the VCO causing the nominal operating frequency thereof to change to a first predetermined frequency; a clamp circuit coupled to a second output of said sensing circuit which is enabled thereby in the absence of the IF signal for providing a control signal to the LO thereby causing the nominal operating frequency thereof to be changed to a second predetermined frequency; and said sensing circuit disabling said offset circuit and said clamp circuit in the presence of the IF signal and the phase locked loop becoming phase locked thereto.

DETAILED DESCRIPTION OF THE PREFERRED EMBODIMENT

Figure 1:
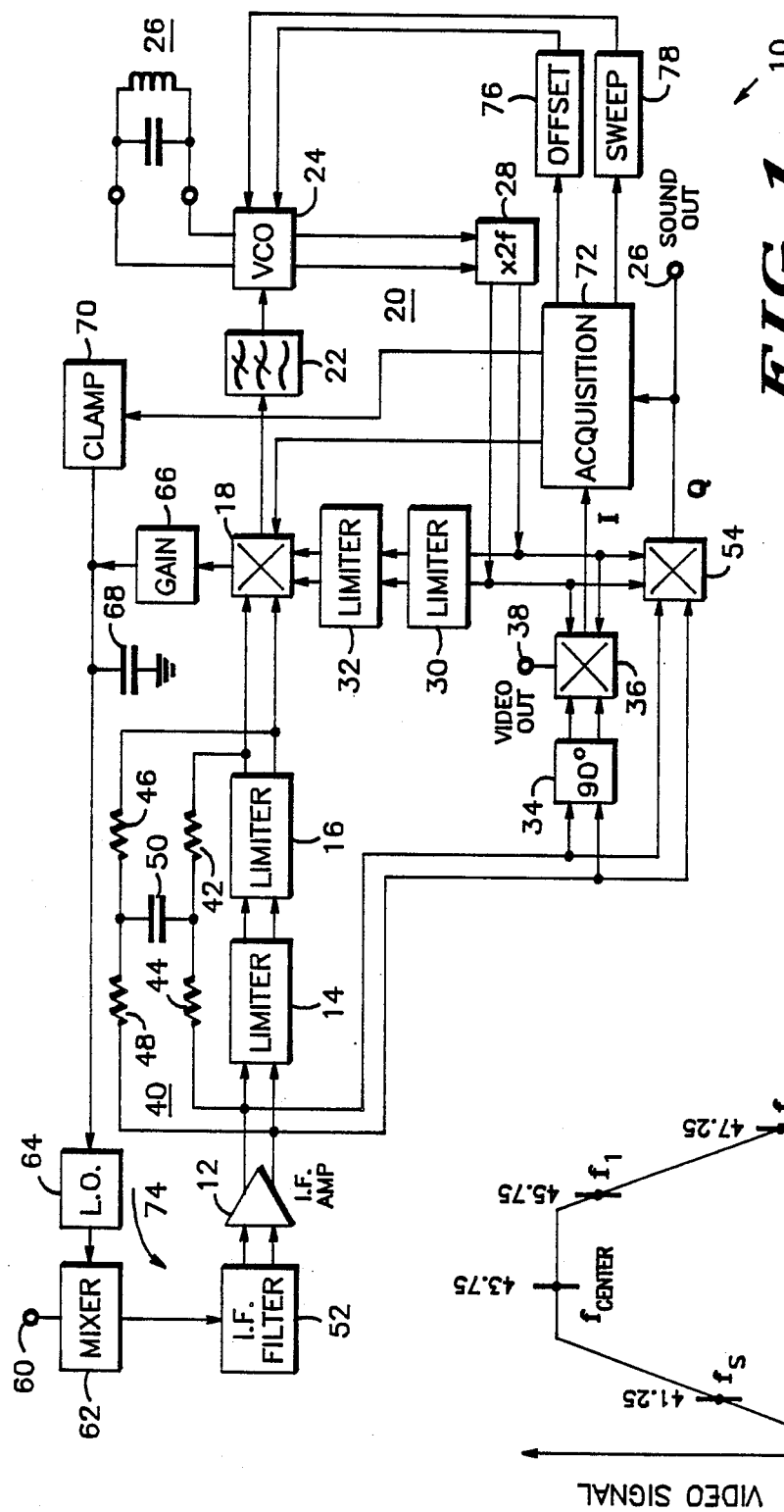
FIG. 1 is a partial block and schematic diagram illustrating the automatic frequency control system of the present invention.

Turning now to FIG. 1 there is shown the improved automatic frequency control (AFC) loop of the present invention in combination with video demodulator circuit 10. Video demodulator circuit 10 is described in detail in the aforementioned patent application "VIDEO DEMODULATOR SYSTEM" filed concurrently herewith the teachings of which are incorporated herein by reference made thereto. It is to be understood that both the AFC loop and the video demodulator loop are suited to be included in a high gain television intermediate frequency (IF) stage.

Briefly, video demodulator circuit 10 provides the video information signal at output 38 of balanced demodulator 36. Video demodulator circuit 10 includes IF amplifier 12 to which the IF television signal is applied and which has outputs coupled both to limiter stage 14 and ninety degree phase shift circuit 34. The amplitude modulation is removed from the IF signal by series connected limiter stages 14 and 16 and applied to the inputs of quadrature phase detector 18. Video demodulator circuit 10 comprises phase locked loop (PLL) 20 which includes detector 18, low pass filter 22, which is coupled between detector 19 and voltage controlled oscillator 24, tuned circuit 26, and times 2 frequency multiplier circuit 28 which is coupled between VCO 24 and series connected limiter stages 30 and 32. The balance outputs of limiter stage 32 are coupled to additional inputs of detector 18. Balanced demodulator 36 has inputs to which outputs of phase shift circuit 34 and frequency multiplier circuit 28 are applied. Feedback is provided by feedback circuit 40 between the outputs of limiter stage 16 to the inputs of limiter stage 14. Feedback circuit 40 comprises resistors 42, 44, 46 and 48 as well as capacitor 50.

As understood, as long as the frequency of the IF signal applied to IF amplifier 12 from IF filter 52 is within the acquisition and lock up range of PLL 20 the video carrier signal will be demodulated to provide the video information signal at output 38 of demodulator 36. Similarly, the IF signal from IF amplifier 12 is also applied in phase quadrature with respect to demodulator 36 to the inputs of balanced demodulator 54. In combination with the inputs from times 2 frequency multiplier 28 demodulator 54 produces the sound information signal at output 56.

Figure 2:
FIG. 2 is a waveform illustrating the bandpass characteristics of the IF filter of the system of FIG. 1.

Turning now to FIG. 2 the bandpass characteristic of IF filter 52 are briefly described. In the United States the nominal center frequency of filter 52 is set at 43.75 MHz. Both the video, $f_v$, and sound, $f_s$, signals occur at 45.75 MHz and 41.25 MHz respectively which frequencies are out of the passband of the filter. Moreover, the adjacent television channel sound signal, $f_a$, appears at a frequency of 47.25 MHz.

The television composite signal is applied from the RF section (not shown) to input terminal 60 to mixer section 62. In general, local oscillator (LO) 64 is operated at the IF signal frequency and produces in conjunction with mixer 60 the IF signal that is applied to the input of filter 52. In most prior art television receivers LO 64 and mixer 62 comprise part of an AFC loop for maintaining IF frequency lock. These prior art AFC loops require a separate tuned circuit tuned to the video signal frequency, i.e., 45.75 MHz.

As will be described in detail, the AFC loop of the present invention does not require a separate tuned circuit thereby eliminating the need for a relative expensive inductor that requires tuning in production. Eliminating the tuned coil also eliminates radiation problems associated with most prior art television receivers.

The AFC loop of the present invention utilizes error output signals generated at the output of phase detector 18 of PLL 20 to control the oscillation frequency of LO 64 to achieve automatic frequency control. AFC loop 74 of the present invention includes gain stage 66 coupled between outputs of phase detector 18 and LO 64 for providing control voltage across capacitor 68 to the control input of the oscillator. Moreover, the AFC loop including clamp circuit 70 is controlled by acquisition circuit 72 in conjunction with PLL 20 to provide symmetrical pull in and acquisition of the IF signal.

Acquisition circuit 72 is responsive to the quadrature related output signals from demodulators 36 and 54 to provide the control functions for sensing (1) no signal and (2) out of lock conditions in order to provide the symmetrical pull in and acquisition of the IF signal.

Provided that the gain around the loop comprising LO 64 is much greater than the gain of PLL 20, VCO 24 will act as the reference frequency of the AFC system of the present invention.

As mentioned above, acquisition circuit 72 is responsive to the quadrature related video and sound signals produced from demodulators 36 and 54 for providing control output signals that are utilized to control the operating frequency of VCO 24 via offset circuit 76 and sweep circuit 78. Also, acquisition circuit 72 provides enabling and disabling control of both phase detector 18 and clamp circuit 70 as will be described.

In operation, if there is no television signal applied to input 60, the in phase (I) and quadrature (Q) output signals from demodulators 36 and 54 will be absent. This condition is sensed by acquisition circuit 72. In response, offset circuit 76 is enabled to provide an offset voltage to the control input of VCO 24. The operating frequency of VCO 24 is then driven from its nominal frequency of 45.75 MHz to the center bandpass frequency 43.75 MHz of IF filter 52. Simultaneously, acquisition circuit 72 enables clamp circuit 70 which produces a predetermined voltage across capacitor 68 to the input of LO 64. This causes the nominal operating frequency to be changed to the center bandpass frequency of IF filter 52, the same as VCO 24. Thus, under no signal conditions, both AFC loop 74 and the VCO loop of the receiver are set to the same frequency corresponding to the center frequency of filter 52. Hence, any drift of LO 64 or VCO 24 occurs about the center frequency of filter 52.

Now, when a signal appears, because both LO 64 and VCO 24 are operating at 43.75 MHz, the IF section will be out of lock. In this condition, beat note frequencies are produced between demodulators 36 and 54 corresponding to the I and Q output signals applied to acquisition circuit 72. The aforementioned U.S. patent "PHASE LOCKED LOOP HAVING FAST LOCK STEERING CIRCUIT" describes in detail the generation of the I and Q beat note signals and is incorporated herein by reference made thereto.

As long as the beat notes are present, indicating an out of lock condition, acquisition circuit 72 will provide a control signal to sweep circuit 78 which, in turn, causes the frequency of VCO 24 to be swept from the initial offset frequency downward to a frequency of 41.75 MHz. Hence, at the first occurrence of the beat note frequencies, the frequency of VCO 24 is initially pulled downward. Once the lower frequency is reached VCO 24 is allowed to sweep upwards towards the video carrier frequency of 45.75 MHz. Simultaneously with VCO 24 being swept downwards phase detector 18 is disabled by acquisition circuit 72. This prevents PLL 20 from locking to the sound carrier signal $f_s$. Once VCO 24 begins sweeping upward in frequency phase detector 18 is again enabled which permits PLL to lock when the frequency of VCO 24 reaches the video signal frequency. The beat note frequencies will disappear as soon as PLL 20 has achieved phase lock of the IF signal. This condition is sensed by acquisition circuit 72 which inhibits both offset circuit 76 and sweep circuit 78. Control of VCO 24 is then released to permit it to operate at its nominal operating frequency.

Upon the occurrence of lock up, clamp circuit 70 is also disabled to allow LO 64 to be driven such that the IF frequency is returned to its correct value (45.75 MHz). It is noted that the gain of the LO loop is much greater than the gain of the VCO loop, therefore VCO 24 only moves several kilohertz from its locked nominal frequency of 45.75 MHz whereas LO 64 can be moved MHz in frequency to correct IF errors of this magnitude.

Figure 3:
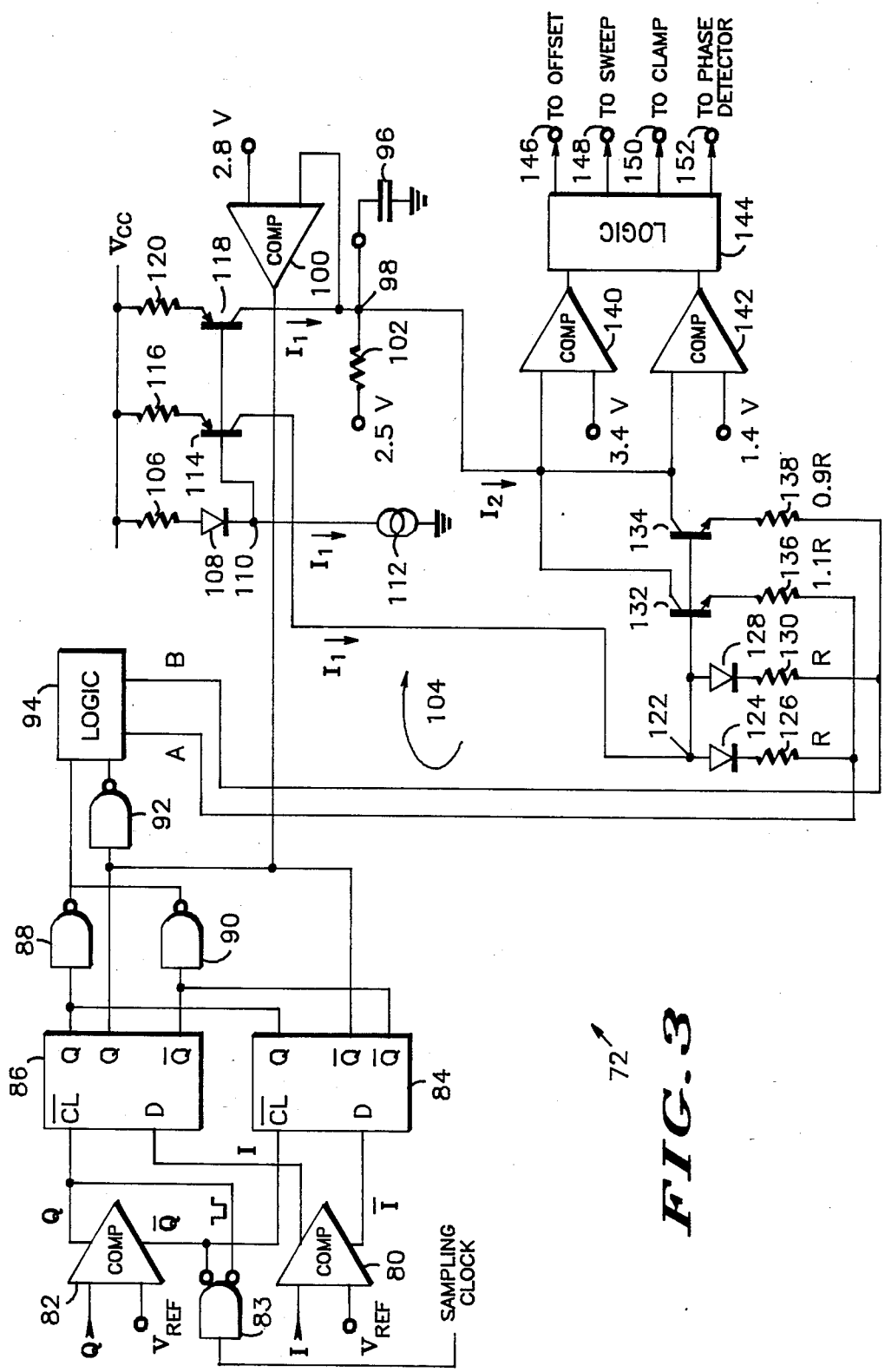
FIG. 3 is a partial block and schematic diagram of the acquisition circuit of the embodiment of FIG. 1.

Referring to FIG. 3 the detail and description of the operation of acquisition circuit 72 is more fully explained. The I and Q signals from demodulators 36 and 54 are applied to respective inputs of comparators 80 and 82. The beat note signals are compared with a reference voltage Vref applied at the second input of the two comparators to provide differentials output signals therefrom. The differential output signals from comparator 80 are applied to the respective data input terminals of D flip-flops 84 and 86 while the differential output signals of comparator 82 are respectively applied to the clock input terminals of the two flip-flops. In addition, a sampling clock signal is applied via Nand gate 83 to the clock terminal of the two flip-flops. A Q output of each of the D flip-flops 84 and 86 are connected to the input of Nand gate 88 the output of which is coupled to an input of logic circuit 94. Similarly, a respective $\overline{Q}$ output of the two D flip-flops or connected to the input of Nand gate 90 the output of which is connected with the output of Nand gate 88 and applied to the first input of logic circuit 94. An additional Q output of D flip-flop 86 is wired connected with an additional $\overline{Q}$ output of D flip-flop 84 to the input of Nand gate 92 the output of which is connected to a second input of logic circuit 94. Logic circuit 94 provides a pair of logic output signals A and B which are utilized to charge and discharge capacitor 96; the latter of which is coupled between node 98 and ground. Comparator 100 has an output connected to the input of Nand gate 92 and a pair of inputs coupled respectively to node 98 and a reference voltage, for example 2.8 volts. Node 98 is returned via resistor 102 to another reference voltage, for instance 2.5 volts. As illustrated the A and B outputs of logic circuit 94 are directly coupled to lock indicator circuit 104 comprising current sourcing and sinking circuitry. The current sourcing circuit comprises reference current source including resistor 106 series connected with diode 108 between supply voltage $V_{cc}$ and node 110. Current source 112 is coupled between node 110 and ground. Transistors 114 and 118 are biased to source a current I1 as their bases are coupled to node 110. The respective emitters of transistors 114 and 118 are returned to $V_{cc}$ via resistors 116 and 120.

Hence, the current I1 is sourced from the collector of transistor 114 to node 122 which is coupled through series connected resistor 124 and diode 126 to the A output of logic circuit 94. Transistor 118 also sources a current I1 directly to node 98. Series connected resistor 130 and diode 130 are coupled between node 122 and the B output of logic circuit 94. Transistors 132 and 134 provide circuitry for sinking current I2 from node 98 as their respective collectors are connected thereto. The bases of these two transistors are connected to node 122 while their respective emitters are coupled via resistors 136 and 138 to the A and B outputs of logic circuit 94. A pair of threshold comparators 140 and 142 have a first input coupled to node 98 and respective outputs coupled to logic circuit 144. Comparator 140 which has a second input connected to a reference potential, for instance, 3.4 volts provides indication of a lock condition. Comparator 142 which has a second input coupled to a reference potential, for example 1.4 volts provides indication of out of lock signal conditions. Logic circuit 144 is responsive to the output signals for generating the various control signals at outputs 146, 148, 150 and 152 to control the enabling and disabling of offset circuit 76, sweep circuit 78, clamp circuit 70 and phase detector 18 as described above in reference to FIG. 1.

As previously mentioned the purpose of acquisition circuit 72 is to detect the presence or absence of the IF signal and to indicate when VCO 24 is phase locked to the signal. With no IF signal the I and Q outputs of demodulators 36 and 54 will contain only noise. In this condition outputs A and B of logic circuit 94 will switch between 0 and 1 logic states with equal time weighting. Hence, the net charge put on lock indicator capacitor 96 will be zero as current is equally sourced and sunk at node 98. Node 98 will therefor be maintained at 2.5 volts which maintains all of the comparators 100, 140 and 142 in a non-operative condition, all outputs are at a zero logic state However, if there is no IF signal but low gain tuner noise outputs A and B may not be switched. If this condition occurs node 98 will then rise in potential until as though PLL 20 is locked until 2.8 volts is reached. At this time the lock test comparator 100 switches output states to remove the inhibit signal at the input of Nand gate 92. If PLL 20 is not locked at this time the input to Nand gate 92 switches to a logic 1 state and the polarity of the A and B outputs of logic circuit 94 are reversed. This causes node 98 to be driven below 2.8 volts which causes an inhibit signal at the output of comparator 100. Comparator 100 will continually provide an inhibit and the enabling output as aforedescribed such that node 98 oscillates about 2.8 volts under these conditions.

If, however, having released or enabling Nand gate 92 the input to Nand gate 92 from D flip flops 84 and B6 is at a logic 0 due to the sampling of the I signal by sample clock circuit 83, the A and B outputs of logic circuit 94 remain unchanged and node 98 will go to 4.3 volts. As the voltage at node 98 exceeds 3.4 volts lock comparator 140 is operated and sweep circuit 78 is disabled as well as clamp circuit 70 by the control signals produce from the respective outputs of logic circuit 144.

When the demodulator circuit is out of lock and beat notes appear from demodulators 36 and 54, flip-flops 80 and 82 are clocked and either the input to Nand gate 88 or Nand gate 90 go to a logic 1. Hence, the output of Nand gate 88 is forced to a logic 0. This causes the A output of logic circuit 94 to become a logic 1 while the B output goes to a logic 0. Thus, I2 becomes greater than I1 and the voltage at node 98 is pulled down to 0.8 volts. However, as the voltage decreases below 1.4 volts beat comparator 142 is operated and the sweep generator is enabled to initiate the acquisition sequence described above.

I claim:

1. In a television receiver having a local oscillator (LO), an intermediate frequency (IF) demodulator section including a pair of quadrature operated demodulators responsive to a received IF signal, a phase locked loop including a phase detector and a voltage controlled oscillator (VCO) for phase locking onto the received IF signal, and an automatic frequency control circuit responsive to the received IF signal for controlling the operating frequency of the LO, the improvement comprising:

sensing means for detecting the absence or presence of the received IF signal to provide a plurality of enabling and disabling control signals at respective outputs, said sensing means being coupled to respective outputs of the demodulators;

an offset circuit coupled to a first output of said sensing means which is enabled thereby in the absence of the received IF signal for providing a control signal to the VCO causing the nominal operating frequency thereof to change to a first predetermined frequency;

a clamp circuit coupled to a second output of said sensing means which is enabled thereby in the absence of the received IF signal for providing a control signal to the LO thereby causing the nominal operating frequency hereof to be changed to a second predetermined frequency; and said sensing means disabling said offset circuit and said clamp circuit in the presence of the received IF signal and the phase locked loop becoming phase locked thereto.

2. The automatic frequency control circuit of claim 1 including:

said sensing means being responsive to output signals produced from the pair of demodulators in response to the presence of the received IF signal and the phase locked loop being in an out of lock condition for providing an additional enabing signal;

a sweep circuit responsive to said additional enabling signal applied thereto from said sensing means for providing a sweep control signal to the VCO which causes the frequency of the VCO to sweep downward from said first predetermined frequency to a third predetermined frequency and then to sweep upward towards said nominal operating frequency; and said sensing means being responsive to the outputs of the pair of demodulators as the VCO becomes phase locked to the received IF signal for disabling said offset circuit, said sweep circuit and said clamp circuit.

3. The automatic frequency control circuit of claim 2 wherein said sensing means provides a signal for disabling the operation of the phase detector such that the frequency of the LO is not affected by the phase detector output during the time that the VCO is being swept downward in frequency by said sweep circuit.

4. In a television receiver having a local oscillator (LO), an intermediate frequency (IF) demodulator section including a pair of quadrature operated demodulators responsive to a received IF signal, a phase locked loop including a phase detector and a voltage controlled oscillator (VCO) for phase locking onto the received IF signal, an automatic frequency control circuit responsive to the received IF signal for controlling the frequency of the LO wherein the improvement comprises:

sensing means coupled to respective outputs of the demodulators and being responsive to output signals produced therefrom for detecting the absence or presence of the received IF signal to provide enabling and disabling control signals accordingly;

first circuit means respnsive to selective ones of said enabling signals supplied from said sensing means for changing the nominal operating frequencies of both of the VCO and LO to first predetermined frequencies in the absence of the received IF signal;

second circuit means responsive to other ones of said selective enabling control signals from said sensing means for initially sweeping the frequency of the VCO downward from said first predetermined frequency to a second predetermined frequency and then upward towards said nominal operating frequency in the presence of the received IF signal and the phase locked loop being in an out of lock condition; and said sensing means providing a disabling control signal for disabling the phase detector to inhibit the output therefrom from affecting the operation of either the LO or VCO during said downward sweep of the frequency of the VCO and providing an enabling control signal for enabling the same during said upward sweep, and said sensing means being responsive to the pair of demodulators for providing disabling control signals for disabling said first and second circuit means as the VCO phase locks to the received IF signal as the frequency of the VCO is swept upward.

5. The automatic frequency control circuit of claim 4 wherein said first circuit means includes:

an offset circuit for providing a control signal to the VCO when enabled; and a voltage clamp circuit for providing a predetermined voltage to the LO when enabled.

* * * * *

UNITED STATES PATENT AND TRADEMARK OFFICE
CERTIFICATE OF CORRECTION

PATENT NO. : 4,796,102

DATED : January 3, 1989

INVENTOR(S) : Michael McGinn

It is certified that error appears in the above-identified patent and that said Letters Patent is hereby corrected as shown below:

Column 6, claim 1, line 61, delete "hereof" insert --thereof--

Signed and Sealed this

Twelfth Day of December, 1989

*Attest:*

JEFFREY M. SAMUELS

*Attesting Officer*     *Acting Commissioner of Patents and Trademarks*